US012023777B2

United States Patent
Kamiki et al.

(10) Patent No.: US 12,023,777 B2
(45) Date of Patent: Jul. 2, 2024

(54) TEMPERATURE REGULATING APPARATUS AND POLISHING APPARATUS

(71) Applicant: EBARA CORPORATION, Tokyo (JP)

(72) Inventors: Keisuke Kamiki, Tokyo (JP); Toru Maruyama, Tokyo (JP); Yasuyuki Motoshima, Tokyo (JP)

(73) Assignee: EBARA CORPORATION, Tokyo (JP)

(*) Notice: Subject to any disclaimer, the term of this patent is extended or adjusted under 35 U.S.C. 154(b) by 420 days.

(21) Appl. No.: 17/610,573

(22) PCT Filed: May 20, 2020

(86) PCT No.: PCT/JP2020/019915
§ 371 (c)(1),
(2) Date: Nov. 11, 2021

(87) PCT Pub. No.: WO2020/241408
PCT Pub. Date: Dec. 3, 2020

(65) Prior Publication Data
US 2022/0212312 A1     Jul. 7, 2022

(30) Foreign Application Priority Data
May 31, 2019 (JP) .................................. 2019-102408

(51) Int. Cl.
*B24B 37/015* (2012.01)
(52) U.S. Cl.
CPC .................................. *B24B 37/015* (2013.01)
(58) Field of Classification Search
CPC ..... B24B 49/14; B24B 37/015; B24B 37/005; B24B 37/04; B24B 37/042; B24B 37/10; B24B 37/34; B24B 7/228; B24B 55/02
See application file for complete search history.

(56) References Cited

U.S. PATENT DOCUMENTS

2006/0053598 A1    3/2006   Kaczmarek et al.
2017/0239778 A1*   8/2017   Maruyama .............. B24B 37/20
(Continued)

FOREIGN PATENT DOCUMENTS

JP    2005-262379 A    9/2005
JP    2007-181910 A    7/2007
(Continued)

OTHER PUBLICATIONS

English translation of KR20080109649A (Year: 2008).*
International Patent Application No. PCT/JP2020/019915; Int'l Search Report; dated Jul. 14, 2020; 5 pages.

*Primary Examiner* — Joel D Crandall
*Assistant Examiner* — Sukwoo James Chang
(74) *Attorney, Agent, or Firm* — BakerHostetler

(57) ABSTRACT

The present invention relates to a temperature regulating apparatus for regulating a temperature of a polishing surface of a polishing pad used for polishing a substrate, such as a wafer. The present invention further relates to a polishing apparatus including such a temperature regulating apparatus. The temperature regulating apparatus (5) includes: a heat exchanger (11) having a heating flow passage (61) and a cooling flow passage (62) formed therein; a holder (90) arranged over the heat exchanger (11); a coupling mechanism (80) configured to detachably fix the heat exchanger (11) to the holder (90), the coupling mechanism (80) including: a first hook (73) fixed to an upper surface of the heat exchanger (11); and a second hook (83) held by the holder (90). The second hook (83) is configured to be able to be engaged with and disengaged from the first hook (73).

11 Claims, 9 Drawing Sheets

(56) References Cited

U.S. PATENT DOCUMENTS

2019/0056183 A1   2/2019  Zhang et al.
2019/0193237 A1   6/2019  Motoshima

FOREIGN PATENT DOCUMENTS

| | | | |
|---|---|---|---|
| JP | 2008-263120 A | 10/2008 | |
| JP | 2015-044245 A | 3/2015 | |
| JP | 2017-077591 A | 4/2017 | |
| JP | 2017-148933 A | 8/2017 | |
| JP | 2018-030181 A | 3/2018 | |
| KR | 20080109649 A | * 12/2008 | ........... B24B 37/015 |
| KR | 2014-0133497 A | 11/2014 | |
| KR | 2017-0098703 A | 8/2017 | |
| WO | WO 2013/118578 A1 | 8/2013 | |

* cited by examiner

-- PRIOR ART --

-- PRIOR ART --

TEMPERATURE REGULATING APPARATUS AND POLISHING APPARATUS

TECHNICAL FIELD

The present invention relates to a temperature regulating apparatus for regulating a temperature of a polishing surface of a polishing pad used for polishing a substrate, such as a wafer. The present invention further relates to a polishing apparatus including such a temperature regulating apparatus.

BACKGROUND ART

CMP (Chemical Mechanical Polishing) apparatus is used in a process of polishing a surface of a wafer in manufacturing of semiconductor devices. The CMP apparatus is configured to polish the surface of the wafer by pressing the wafer against a polishing pad on a polishing table by a polishing head while rotating the polishing table. During polishing, slurry is supplied onto the polishing pad. The surface of the wafer is planarized by a chemical action of the slurry and a mechanical action of abrasive grains contained in the slurry.

A polishing rate of the wafer depends not only on a polishing load on the wafer pressed against the polishing pad but also on a temperature of the polishing surface of the polishing pad. This is because the chemical action of the slurry on the wafer depends on the temperature. Therefore, in manufacturing of semiconductor devices, it is important to keep the temperature of the polishing surface of the polishing pad at an optimum value during polishing of the wafer in order to increase the polishing rate of the wafer and keep the polishing rate constant.

Therefore, a temperature regulating apparatus has been conventionally used to regulate the temperature of the polishing surface of the polishing pad. The temperature regulating apparatus includes a heat exchanger located above the polishing pad. During polishing of the wafer, the heat exchanger exchanges heat between the polishing pad and a fluid flowing in the heat exchanger in a state where the slurry exists between the polishing pad and the heat exchanger, thereby regulating the temperature of the polishing surface.

CITATION LIST

Patent Literature

Patent document 1: Japanese laid-open patent publication No. 2015-44245

SUMMARY OF INVENTION

Technical Problem

FIG. 12 is a schematic view showing a conventional temperature regulating apparatus, and FIG. 13 is a cross-sectional view taken along line A-A of FIG. 12. As shown in FIGS. 12 and 13, a temperature regulating apparatus 105 includes a heat exchanger 111 having a fluid passage (not shown) formed therein, and a holder 190 arranged over the heat exchanger 111. The heat exchanger 111 is held by the holder 190. The heat exchanger 111 is located over a polishing surface 103a of a polishing pad 103, so that a bottom surface of the heat exchanger 111 faces the polishing surface 103a of the polishing pad 103. During polishing of the wafer, slurry 200 exits between the heat exchanger 111 and the polishing surface 103a.

A plurality of sockets 173 (only one socket 173 is depicted in FIG. 13) are fixed to an upper surface of the heat exchanger 111. The heat exchanger 111 is fixed to the holder 190 by screwing bolts 183 into the sockets 173, respectively, through a plurality of through-holes 190a of the holder 190 (only one through-hole 190a is depicted in FIG. 13).

However, in the above-described fixing configuration, it is necessary to screw the plurality of bolts 183 into the plurality of sockets 173, respectively. This results in low workability of fixing and removing the heat exchanger 111. Moreover, it takes a long time to fix and remove the heat exchanger 111. In addition, due to a difference in coefficient of thermal expansion between the heat exchanger 111 and the holder 190, excessive stress may be generated in the socket 173 during polishing of the wafer, and as a result, the socket 173 may be damaged. Such excessive stress generated in the socket 173 can be a cause of low reliability of the temperature regulating apparatus 105.

FIG. 14 is a schematic view showing a state in which the heat exchanger 111 is removed from the holder 190. Each socket 173 includes a female thread 175 and an outer cylindrical body 174 into which the female thread 175 is inserted. The female thread 175 is fixed to an inner circumferential surface of the outer cylindrical body 174, and the outer cylindrical body 174 is fixed to the upper surface of the heat exchanger 111.

Since the fluid having a high temperature (for example, 60° C. to 80° C.) flows through the heat exchanger 111 during polishing of the wafer, the heat exchanger 111, the holder 190, the bolts 183, and the sockets 173 thermally expand during polishing of the wafer. Typically, the holder 190, the bolts 183, and the female threads 175 are made of metal (e.g., stainless steel). On the other hand, the heat exchanger 111 and the outer cylindrical body 174 are formed of a material having excellent wear resistance and high thermal conductivity (e.g., ceramic, such as SiC). Due to difference in coefficient of thermal expansion between these materials, rates of change in volume of the holder 190, the bolts 183, and the female threads 175 during polishing of wafer are greater than rates of change in volume of the heat exchanger 111 and the outer cylindrical body 174. As a result, during polishing of the wafer, a load is applied to the outer cylindrical body 174 from the bolts 183 and the female threads 175, and the outer cylindrical body 174 may be damaged.

Therefore, an object of the present invention is to provide a temperature regulating apparatus which improves workability in fixing and removing a heat exchanger and has excellent reliability. Another object of the present invention is to provide a polishing apparatus including such a temperature regulating apparatus.

Solution to Problem

In an embodiment, there is provided a temperature regulating apparatus for regulating a temperature of a polishing surface of a polishing pad, comprising: a heat exchanger having a heating flow passage and a cooling flow passage formed therein; a holder arranged over the heat exchanger; a coupling mechanism configured to detachably fix the heat exchanger to the holder, the coupling mechanism including: a first hook fixed to an upper surface of the heat exchanger; and a second hook held by the holder, the second hook being configured to be able to be engaged with and disengaged from the first hook.

In an embodiment, the first hook includes: a first base fixed to the upper surface of the heat exchanger; and a first protrusion protruding laterally from the first base, the second hook includes: a second base extending through the holder; and a second protrusion protruding laterally from the second base, the second protrusion being configured to be able to contact a lower surface of the first protrusion.

In an embodiment, the second hook is rotatable about its own axis.

In an embodiment, the coupling mechanism further includes: a screw arranged in the first hook; and a spiral structure embedded in the heat exchanger, the screw being screwed into the spiral structure through a through-hole formed in the first hook.

In an embodiment, the coupling mechanism further includes a coil spring into which the second base is inserted, the coil spring being arranged on an upper surface of the holder.

In an embodiment, the holder has a housing chamber in which the first hook and the second hook are arranged.

In an embodiment, the second hook is arranged outwardly of the first hook in a radial direction of the heat exchanger.

In an embodiment, the second hook comprises two second hooks, the two second hooks being arranged on both sides of the first hook in a circumferential direction of the heat exchanger.

In an embodiment, the coupling mechanism comprises a plurality of coupling mechanisms arranged in a circumferential direction of the heat exchanger.

In an embodiment, the heat exchanger has a side surface composed of a water-repellent coating layer.

In an embodiment, there is provided a polishing apparatus comprising: a polishing table configured to support a polishing pad; a polishing head configured to press a substrate against a polishing surface of the polishing pad; and the temperature regulating apparatus configured to regulate a temperature of the polishing surface by exchanging heat with the polishing pad.

Advantageous Effects of Invention

According to the present invention, the heat exchanger is fixed to the holder by the engagement between the first hook fixed to the upper surface of the heat exchanger and the second hook held by the holder. Further, the heat exchanger can be removed from the holder by disengaging the second hook from the first hook. As a result, the workability in fixing and removing the heat exchanger can be improved.

Further, according to the above-described configuration, the engagement between the first hook and the second hook can allow mutual displacement of these hooks to some degree, as compared with the conventional engagement between the bolt and the female thread. Specifically, the second hook can be displaced relative to the first hook while maintaining engagement with the first hook. Therefore, the combination of the first hook and the second hook can relieve a stress that may be generated in the first hook during polishing of the substrate. As a result, the reliability of the temperature regulating apparatus can be improved.

DESCRIPTION OF EMBODIMENTS

Hereinafter, embodiments of the present invention will be described with reference to the drawings.

Figure 1:
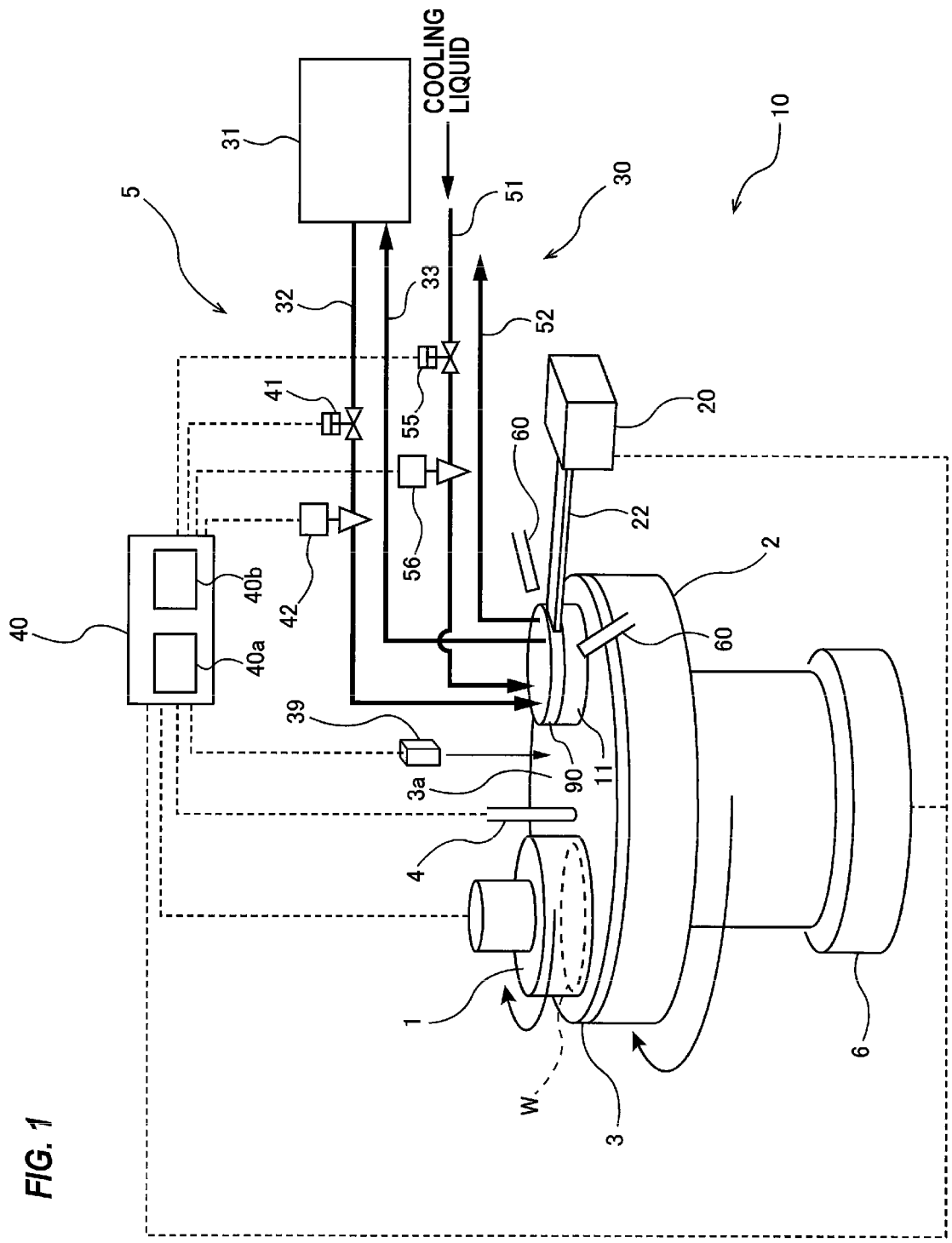
FIG. 1 is a schematic view showing an embodiment of a polishing apparatus including a temperature regulating apparatus.

FIG. 1 is a schematic view showing an embodiment of a polishing apparatus including a temperature regulating apparatus. As shown in FIG. 1, a polishing apparatus 10 includes a polishing head 1 configured to hold and rotate a wafer W (which is an example of a substrate), a polishing table 2 for supporting a polishing pad 3, a slurry supply nozzle 4 configured to supply slurry onto a surface of the polishing pad 3, and a temperature regulating apparatus 5 configured to regulate a temperature of a polishing surface 3a of the polishing pad 3. The surface (upper surface) of the polishing pad 3 constitutes the polishing surface 3a for polishing the wafer W.

The polishing head 1 is movable in a vertical direction and is rotatable about an axis thereof in a direction indicated by arrow. The wafer W is held on a lower surface of the polishing head 1 by vacuum suction or the like. A table motor 6 is coupled to the polishing table 2, so that the polishing table 2 can rotate in a direction indicated by arrow. As shown in FIG. 1, the polishing head 1 and the polishing table 2 rotate in the same direction. The polishing pad 3 is attached to an upper surface of the polishing table 2.

The polishing apparatus 10 includes an operation controller 40 configured to control operations of the polishing head 1, the table motor 6, the slurry supply nozzle 4, and the temperature regulating apparatus 5. The operation controller 40 is composed of at least one computer. The operation controller 40 includes a memory 40a and an arithmetic device 40b. The arithmetic device 40b includes a CPU (central processing unit) or a GPU (graphic processing unit) configured to perform arithmetic operations according to instructions included in programs stored in the memory 40a. The memory 40a includes a main memory (for example, a random-access memory) to which the arithmetic device 40b is accessible, and an auxiliary memory (for example, a hard disk drive or a solid state drive) for storing data and programs.

Polishing of the wafer W is performed as follows. The wafer W to be polished is held by the polishing head 1 and rotated by the polishing head 1. The polishing table 2 is rotated by the table motor 6 together with the polishing pad 3. In this state, the slurry is supplied from the slurry supply nozzle 4 onto the polishing surface 3a of the polishing pad 3, and the surface of the wafer W is pressed against the polishing surface 3a of the polishing pad 3 by the polishing head 1. The surface of the wafer W is polished by sliding contact with the polishing pad 3 in the presence of the slurry. The surface of the wafer W is planarized by the chemical action of the slurry and the mechanical action of the abrasive grains contained in the slurry.

The temperature regulating apparatus 5 includes a heat exchanger 11 configured to regulate the temperature of the polishing surface 3a by exchanging heat with the polishing pad 3, a holder 90 arranged over the heat exchanger 11, a fluid supply system 30 configured to supply a heating fluid and a cooling fluid, each having a controlled temperature, to the heat exchanger 11, and an elevating mechanism 20 coupled to the heat exchanger 11. The heat exchanger 11 is located over the polishing surface 3a of the polishing table 2 and the polishing pad 3.

The heat exchanger 11 has a bottom surface facing the polishing surface 3a of the polishing pad 3, and the heat exchanger 11 is held by the holder 90. The heat exchanger 11 and holder 90 as a whole have a cylindrical shape. The bottom surface of the heat exchanger 11 is flat and circular. In this embodiment, the heat exchanger 11 and the holder 90 are made of different materials. More specifically, the holder 90 is made of metal (for example, stainless steel), while the heat exchanger 11 is made of a material having excellent wear resistance and high thermal conductivity (for example, ceramic, such as SiC).

The holder 90 has a circular upper surface. The holder 90 is fixed to an arm 22 and is coupled to the elevating mechanism 20 via the arm 22. The elevating mechanism 20 is configured to raise and lower the heat exchanger 11 and the holder 90. More specifically, the elevating mechanism 20 is configured to move the bottom surface of the heat exchanger 11 in a direction closer to the polishing surface 3a of the polishing pad 3 and in a direction away from the polishing surface 3a of the polishing pad 3. The elevating mechanism 20 includes an actuator (not shown), such as a motor or an air cylinder. The operation of the elevating mechanism 20 is controlled by the operation controller 40.

The fluid supply system 30 includes a heating-fluid supply tank 31 as a heating-fluid supply source for storing the temperature-controlled heating fluid, and a heating-fluid supply pipe 32 and a heating-fluid return pipe 33 coupling the heating-fluid supply tank 31 to the heat exchanger 11. Ends of the heating-fluid supply pipe 32 and the heating-fluid return pipe 33 are coupled to the heating-fluid supply tank 31, and the other ends are coupled to the heat exchanger 11.

The heating fluid having a controlled temperature is supplied from the heating-fluid supply tank 31 to the heat exchanger 11 through the heating-fluid supply pipe 32, flows through the heat exchanger 11, and is returned to the heating-fluid supply tank 31 from the heat exchanger 11 through the heating-fluid return pipe 33. In this way, the heating fluid circulates between the heating-fluid supply tank 31 and the heat exchanger 11. The heating-fluid supply tank 31 has a heater (not shown), so that the heating fluid is heated to a predetermined temperature by the heater.

The fluid supply system 30 further includes a first on-off valve 41 and a first flow-rate control valve 42 attached to the heating-fluid supply pipe 32. The first flow-rate control valve 42 is arranged between the heat exchanger 11 and the first on-off valve 41. The first on-off valve 41 is a valve that does not have a flow rate regulating function, while the first flow-rate control valve 42 is a valve that has a flow rate regulating function.

The fluid supply system 30 further includes a cooling-fluid supply pipe 51 and a cooling-fluid discharge pipe 52, both of which are coupled to the heat exchanger 11. The cooling-fluid supply pipe 51 is coupled to a cooling-fluid supply source (for example, a cold-water supply source) provided in a factory where the polishing apparatus 10 is installed. The cooling fluid is supplied to the heat exchanger 11 through the cooling-fluid supply pipe 51, flows through the heat exchanger 11, and is discharged from the heat exchanger 11 through the cooling-fluid discharge pipe 52. In one embodiment, the cooling fluid that has flowed through the heat exchanger 11 may be returned to the cooling-fluid supply source through the cooling-fluid discharge pipe 52.

The fluid supply system 30 further includes a second on-off valve 55 and a second flow-rate control valve 56 attached to the cooling-fluid supply pipe 51. The second flow-rate control valve 56 is arranged between the heat exchanger 11 and the second on-off valve 55. The second on-off valve 55 is a valve that does not have a flow rate regulating function, while the second flow-rate control valve 56 is a valve that has a flow rate regulating function.

The first on-off valve 41, the first flow-rate control valve 42, the second on-off valve 55, and the second flow-rate control valve 56 are coupled to the operation controller 40, so that the operations of the first on-off valve 41, the first flow-rate control valve 42, the second on-off valve 55, and the second flow-rate control valve 56 are controlled by the operation controller 40.

The temperature regulating apparatus 5 further includes a pad temperature measuring device 39 for measuring the temperature of the polishing surface 3a of the polishing pad 3 (which may be referred to as pad surface temperature). The pad temperature measuring device 39 is coupled to the operation controller 40. The operation controller 40 is configured to operate the first flow-rate control valve 42 and the second flow-rate control valve 56 based on the pad surface temperature measured by the pad temperature measuring device 39. The first on-off valve 41 and the second on-off valve 55 are normally open. The pad temperature measuring device 39 may be a radiation thermometer capable of measuring the temperature of the polishing surface 3a of the polishing pad 3 in a non-contact manner. The pad temperature measuring device 39 is arranged above the polishing surface 3a.

The pad temperature measuring device 39 measures the pad surface temperature in a non-contact manner and sends a measured value of the pad surface temperature to the operation controller 40. The operation controller 40 operates the first flow-rate control valve 42 and the second flow-rate control valve 56 to control the flow rates of the heating fluid and the cooling fluid based on the measured pad surface temperature so that the pad surface temperature is maintained at a preset target temperature. The first flow-rate control valve 42 and the second flow-rate control valve 56 operate according to control signals from the operation controller 40 to regulate the flow rate of the heating fluid and the flow rate of the cooling fluid to be supplied to the heat exchanger 11. The heat exchange is performed between the heating and cooling fluids flowing through the heat exchanger 11 and the polishing pad 3. As a result, the pad surface temperature changes.

By such feedback control, the temperature of the polishing surface 3a of the polishing pad 3 (i.e., the pad surface temperature) is maintained at a predetermined target temperature. PID control can be used as the feedback control. The target temperature of the polishing pad 3 is determined based on a type of film constituting the surface of the wafer W or a polishing process. The determined target temperature is input in advance to the operation controller 40 and stored in the memory 40a.

The heating fluid to be supplied to the heat exchanger 11 may be a heating liquid, such as hot water. The heating fluid is heated to, for example, about 80° C. by the heater (not shown) of the heating-fluid supply tank 31. In order to raise the surface temperature of the polishing pad 3 more quickly, silicone oil may be used as the heating fluid. When the silicone oil is used as the heating fluid, the silicone oil is heated to 100° C. or higher (for example, about 120° C.) by the heater of the heating-fluid supply tank 31. The cooling fluid to be supplied to the heat exchanger 11 may be a cooling liquid, such as cold water or silicone oil. When silicone oil is used as the cooling fluid, a chiller as the cooling-fluid supply source may be coupled to the cooling-fluid supply pipe 51, and the silicone oil may be cooled to 0° C. or lower by the chiller, so that the polishing pad 3 can be quickly cooled. Pure water can be used as the cold water. In order to cool the pure water to produce the cold water, a chiller may be used as the cooling-fluid supply source. In this case, the cold water that has flown through the heat exchanger 11 may be returned to the chiller through the cooling-fluid discharge pipe 52.

The heating-fluid supply pipe 32 and the cooling-fluid supply pipe 51 are completely independent pipes. Therefore, the heating fluid and the cooling fluid are simultaneously supplied to the heat exchanger 11 without being mixed. The heating-fluid return pipe 33 and the cooling-fluid discharge pipe 52 are also completely independent pipes. Therefore, the heating fluid is returned to the heating-fluid supply tank 31 without being mixed with the cooling fluid, and the cooling fluid is discharged or returned to the cooling-fluid supply source without being mixed with the heating fluid.

The temperature regulating apparatus 5 further includes a plurality of cleaning nozzles 60 for cleaning the heat exchanger 11 by spraying pure water onto the side surface of the heat exchanger 11. These cleaning nozzles 60 are oriented toward the side surface of the heat exchanger 11. In the present embodiment, two cleaning nozzles 60 are provided, but three or more cleaning nozzles 60 may be provided. Each cleaning nozzle 60 emits a jet of pure water to remove the slurry that has been used in polishing of the wafer W from the side surface of the heat exchanger 11.

Figure 2:
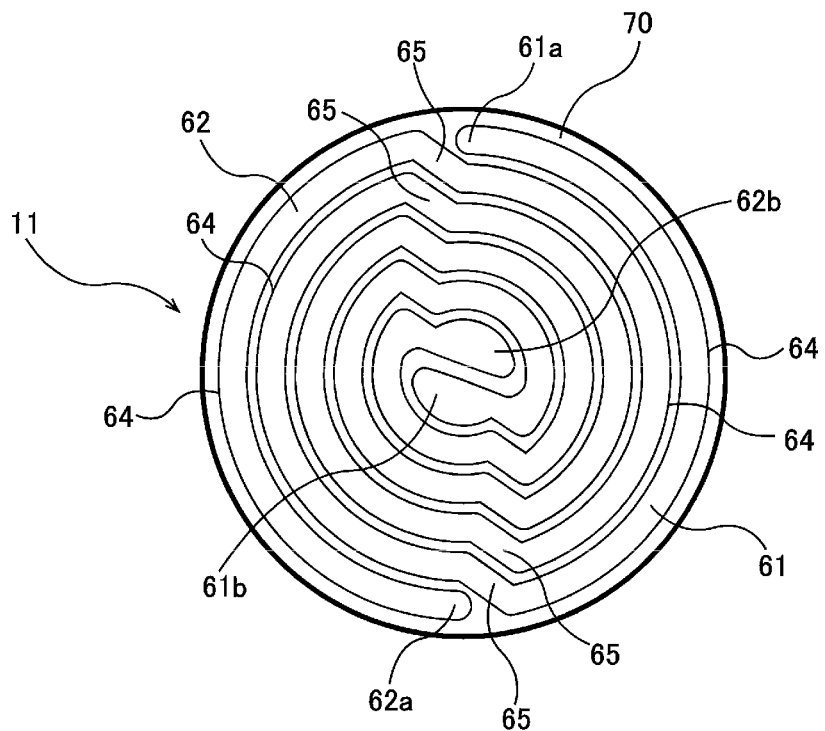
FIG. 2 is a horizontal cross-sectional view showing a heat exchanger.

Next, the heat exchanger 11 will be described with reference to FIG. 2. FIG. 2 is a horizontal cross-sectional view showing the heat exchanger 11. As shown in FIG. 2, the heat exchanger 11 includes a flow-passage structure 70. A heating flow passage 61 and a cooling flow passage 62 are formed in the flow-passage structure 70. The heating flow passage 61 and the cooling flow passage 62 extend adjacent to each other (i.e., side by side) and extend spirally. Further, the heating flow passage 61 and the cooling flow passage 62 have a point-symmetrical shape and have the same length. Each of the heating flow passage 61 and the cooling flow passage 62 is basically composed of a plurality of arc flow passages 64 having a constant curvature and a plurality of inclined flow passages 65 coupling the arc flow passages 64. Two adjacent arc flow passages 64 are coupled by each inclined flow passage 65.

According to such configurations, outermost peripheral portions of the heating flow passage 61 and the cooling flow passage 62 can be arranged at the outermost peripheral portion of the heat exchanger 11. Specifically, the entire bottom surface of the heat exchanger 11 is located below the heating flow passage 61 and the cooling flow passage 62, so that the heating fluid and the cooling fluid can quickly heat and cool the polishing surface 3a of the polishing pad 3. The heat exchange between the heating and cooling fluids and the polishing pad 3 is performed in the presence of the slurry (not shown) between the polishing surface 3a of the polishing pad 3 and the bottom surface of the flow-passage structure 70 (i.e., the bottom surface of the heat exchanger 11).

The heating-fluid supply pipe 32 (see FIG. 1) is coupled to an inlet 61a of the heating flow passage 61, and the heating-fluid return pipe 33 (see FIG. 1) is coupled to an outlet 61b of the heating flow passage 61. The cooling-fluid supply pipe 51 (see FIG. 1) is coupled to an inlet 62a of the cooling flow passage 62, and the cooling-fluid discharge pipe 52 (see FIG. 1) is coupled to an outlet 62b of the cooling flow passage 62. The heating-fluid supply pipe 32, the heating-fluid return pipe 33, the cooling-fluid supply pipe 51, and the cooling-fluid discharge pipe 52 are coupled to the inlet 61a, the outlet 61b, the inlet 62a, and the outlet 62b, respectively, via the holder 90 (see FIG. 1).

The inlets 61a and 62a of the heating flow passage 61 and the cooling flow passage 62 are located at the peripheral portion of the heat exchanger 11, and the outlets 61b and 62b of the heating flow passage 61 and the cooling flow passage 62 are located at the central portion of the heat exchanger 11. Therefore, the heating fluid and the cooling fluid spirally flow from the peripheral portion to the central portion of the heat exchanger 11. The heating flow passage 61 and the cooling flow passage 62 are completely separated, and the heating fluid and the cooling fluid are not mixed in the heat exchanger 11.

Figure 3:
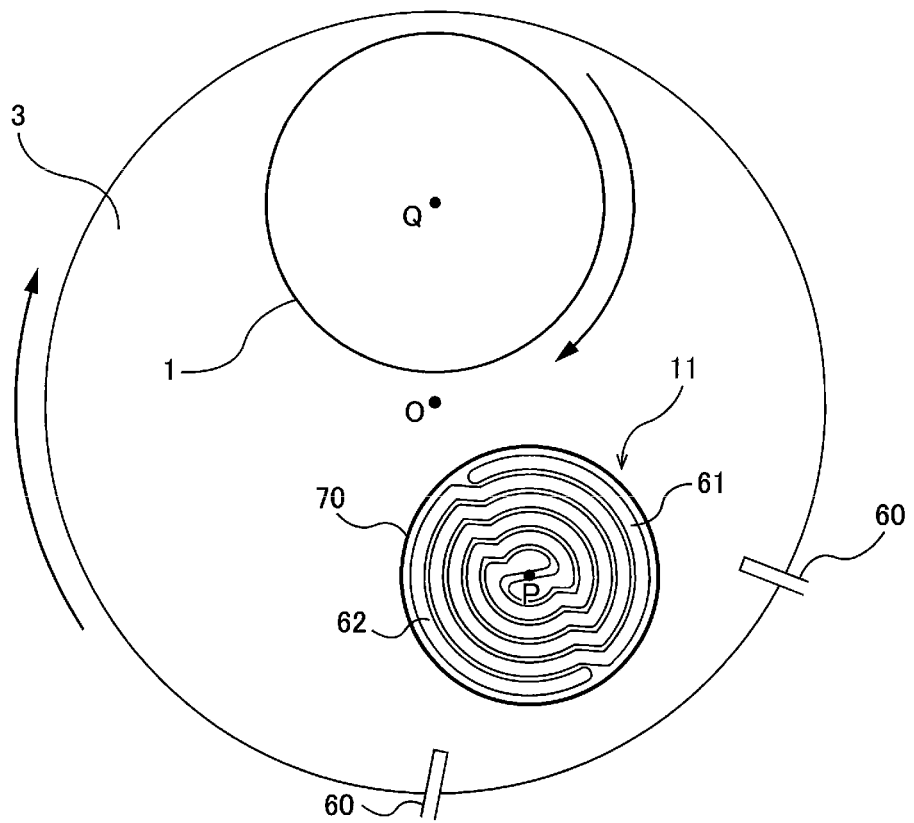
FIG. 3 is a plan view showing a positional relationship between the heat exchanger and a polishing head on a polishing pad.

FIG. 3 is a plan view showing a positional relationship between the heat exchanger 11 and the polishing head 1 on the polishing pad 3. In FIG. 3, the holder 90 is not shown. The heat exchanger 11 is circular when viewed from above, and the diameter of the heat exchanger 11 is smaller than the diameter of the polishing head 1. A distance from a rotation center O of the polishing pad 3 to a center P of the heat exchanger 11 is the same as a distance from the rotation center O of the polishing pad 3 to a center Q of the polishing head 1. Since the heating flow passage 61 and the cooling flow passage 62 are adjacent to each other, the heating flow passage 61 and the cooling flow passage 62 are arranged not only along the radial direction of the polishing pad 3 but also along the circumferential direction of the polishing pad 3. Therefore, while the polishing table 2 and the polishing pad 3 are rotating, the polishing pad 3 exchanges heat with both the heating fluid and the cooling fluid. The two cleaning nozzles 60 are arranged at both sides of the heat exchanger 11.

Figure 4:
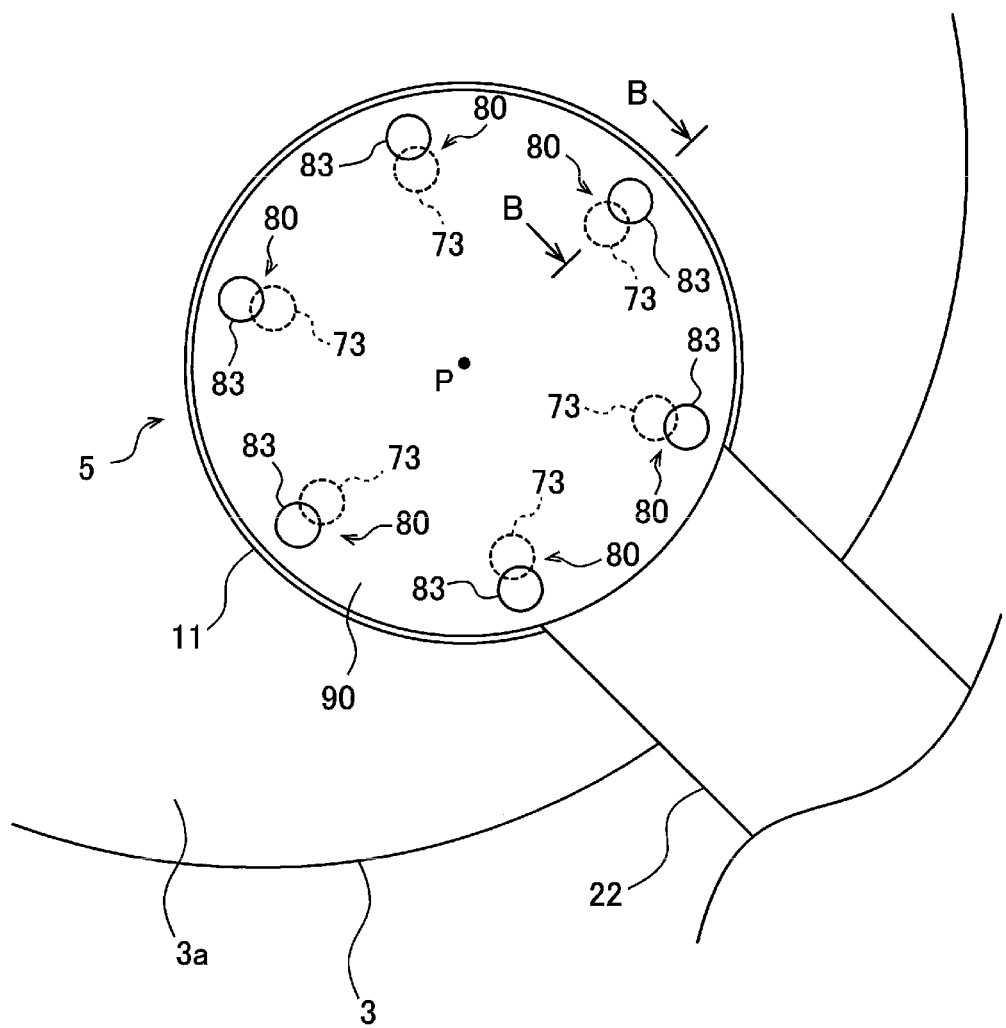
FIG. 4 is a schematic view showing an embodiment of a method of fixing the heat exchanger to a holder.
Figure 5:
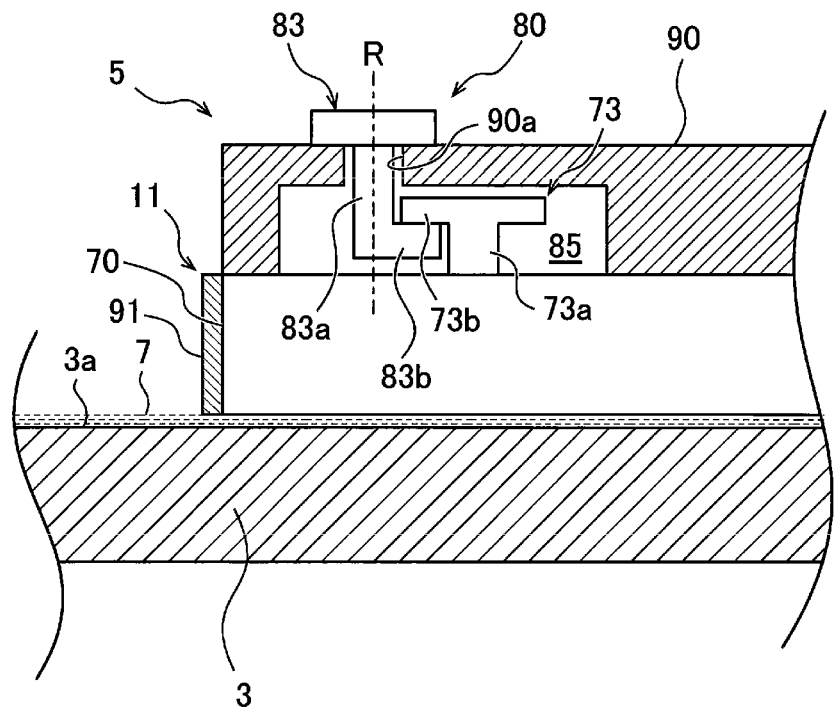
FIG. 5 is a cross-sectional view taken along line B-B of FIG. 4.

FIG. 4 is a schematic view showing an embodiment of a method of fixing the heat exchanger 11 to the holder 90, and FIG. 5 is a cross-sectional view taken along line B-B of FIG. 4. FIG. 5 shows a state when the holder 90 holds the heat exchanger 11. In FIG. 5, the heating flow passage 61 and the cooling flow passage 62 are not shown. As shown in FIGS. 4 and 5, the temperature regulating apparatus 5 further includes a plurality of coupling mechanisms 80 configured to detachably fix the heat exchanger 11 to the holder 90. As shown in FIG. 4, the plurality of coupling mechanisms 80 are arranged along the circumferential direction of the heat exchanger 11 over the entire circumference of the heat exchanger 11. In one embodiment, the plurality of coupling mechanisms 80 may be arranged at equal intervals in the circumferential direction of the heat exchanger 11.

As shown in FIG. 5, each coupling mechanism 80 has a first hook 73 fixed to the upper surface of the heat exchanger 11 (i.e., the upper surface of the flow-passage structure 70) and a second hook 83 held by the holder 90. The second hook 83 is configured to be engageable with and detachable from the first hook 73. The holder 90 has a housing chamber 85 in which the first hook 73 and the second hook 83 are arranged. When the holder 90 holds the heat exchanger 11, the entire first hook 73 and a part of the second hook 83 are located in the housing chamber 85.

More specifically, the first hook 73 includes a first base 73a fixed to the upper surface of the heat exchanger 11 and a first protrusion 73b protruding laterally from the first base 73a. The second hook 83 includes a second base 83a extending through the holder 90, and a second protrusion 83b protruding laterally from the second base 83a. The second base 83a extends through a through-hole 90a of the holder 90. The second protrusion 83b is configured to be able to contact a lower surface of the first protrusion 73b. When the holder 90 holds the heat exchanger 11 (i.e., when the first hook 73 and the second hook 83 are in engagement), an upper surface of the second protrusion 83b is in contact with the lower surface of the first protrusion 73b.

Figure 6:
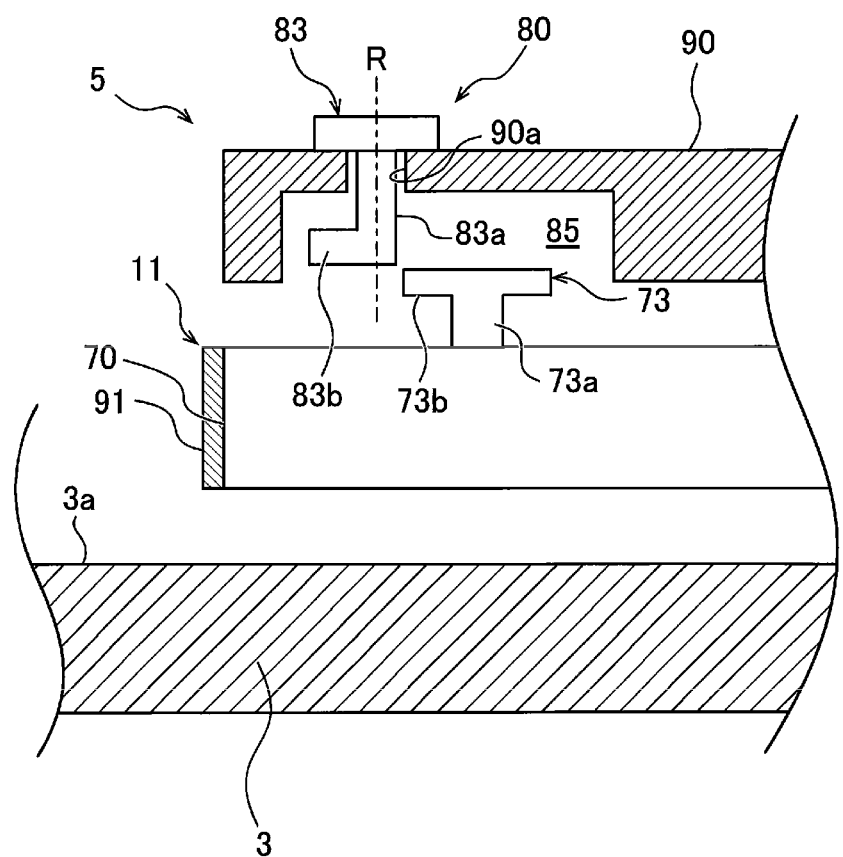
FIG. 6 is a schematic view showing a state in which the heat exchanger is removed from the holder.

FIG. 6 is a schematic view showing a state in which the heat exchanger 11 is removed from the holder 90. The second hook 83 is configured to be rotatable about an axis R extending in parallel with the second base 83a. By rotating the second hook 83 about the axis R, the second hook 83 can be disengaged from the first hook 73. When all the second hooks 83 are disengaged from the first hooks 73, the heat exchanger 11 can be removed from the holder 90.

Similarly, by rotating the second hook 83 about the axis R until the upper surface of the second protrusion 83b contacts the lower surface of the first protrusion 73b, with the upper surface of the heat exchanger 11 pressed against the lower surface of the holder 90, the second hook 83 and the first hook 73 can be engaged with each other, so that the heat exchanger 11 can be fixed to the holder 90. By engaging all the second hooks 83 with all the first hooks 73, respectively, the heat exchanger 11 is securely fixed to the holder 90.

As described above, in the present embodiment, the heat exchanger 11 is fixed to the holder 90 by the engagement between the first hooks 73, which are fixed to the upper surface of the heat exchanger 11, and the second hooks 83 held by the holder 90. Further, the heat exchanger 11 can be removed from the holder 90 by disengaging the second hooks 83 from the first hooks 73. In this manner, the heat exchanger 11 can be fixed and removed with simple operations, which improve the workability in fixing and removing the heat exchanger 11. Further, since a variation in work by an operator can be suppressed, the heat exchanger 11 can be stably fixed and removed.

During polishing of the wafer W, the fluid with a high temperature (for example, 60° C. to 80° C.) flows through the heat exchanger 11. As a result, the flow-passage structure 70, the holder 90, and the coupling mechanisms 80 thermally expand. As described above, in the present embodiment, the holder 90 is made of metal (for example, stainless steel), and the flow-passage structure 70 is made of material having excellent wear resistance and high thermal conductivity (for example, ceramic, such as SiC).

The first hooks 73 are made of metal (for example, stainless steel). The second hooks 83 are made of resin material. In one embodiment, the first hooks 73 may be made of ceramic, such as SiC, and the second hook 83 may be made of metal, such as stainless steel.

According to the configurations of the present embodiment, the engagement of the first hooks 73 and the second hooks 83 allows mutual displacement to some degree as compared with the engagement of the conventional bolts and female threads. Specifically, the second hooks 83 can be displaced relative to the first hooks 73 while maintaining the engagement with the first hooks 73. Therefore, the combination of the first hooks 73 and the second hooks 83 can relieve stress that may be generated in the first hooks 73 during polishing of the wafer W. As a result, the reliability of the temperature regulating apparatus 5 can be improved.

As shown in FIGS. 5 and 6, the heat exchanger 11 further includes a water-repellent coating layer 91 provided on the side surface of the flow-passage structure 70. The side surface of the heat exchanger 11 is composed of the water-repellent coating layer 91. As shown in FIG. 5, the slurry 7 is present between the heat exchanger 11 and the polishing surface 3a during polishing of the wafer W, and the slurry 7 may be attached to a surface of the coating layer 91 during polishing of the wafer W. According to this embodiment, the slurry 7 attached to the surface of the coating layer 91 gathers during polishing of the wafer W, and the volume thereof increases. As a result, the slurry 7 is less likely to dry, and the slurry 7 is prevented from sticking to the side surface of the heat exchanger 11 during polishing of the wafer W.

Examples of the coating layer 91 include a film made of polytetrafluoroethylene. Polytetrafluoroethylene is known as Teflon (registered trademark). Forming of the coating layer 91 is performed in a high temperature environment (for example, 100° C. to 400° C.) before the heat exchanger 11 is attached to the holder 90. If the coating layer 91 is peeled off as the heat exchanger 11 is used, it is necessary to form the coating layer 91 again.

Figure 14:
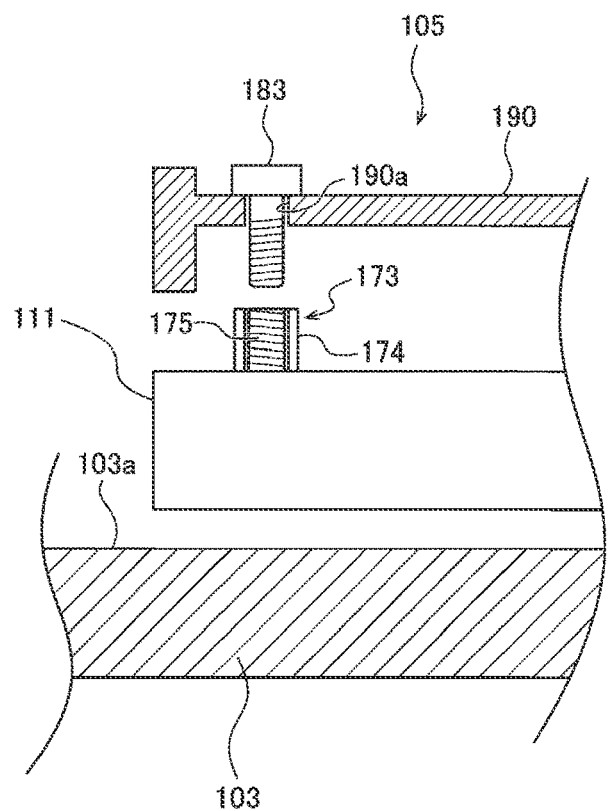
FIG. 14 is a schematic view showing a state in which a heat exchanger is removed from a holder.

In the conventional configurations shown in FIG. 14, the socket 173 includes the female thread 175 and the outer cylindrical body 174 composed of different materials. Therefore, when the coating layer is peeled off and the heat exchanger 111 is exposed to a high temperature in the step of forming the coating layer again, the female thread 175 may thermally expand more larger than the outer cylindrical body 174, thus causing damage to the outer cylindrical body 174. In contrast, the first hook 73 is made of a single material, and therefore, excessive stress is not generated in the first hook 73 even when the first hook 73 thermally expands. Therefore, if the coating layer 91 is peeled off, the heat exchanger 11 is removed from the holder 90, and the coating layer 91 can be formed again. As a result, the flow-passage structure 70 and the first hooks 73 can be reused, and the manufacturing cost of the temperature regulating apparatus 5 can be reduced. In one embodiment, the coating layer 91 may be provided on the bottom surface of the flow-passage structure 70.

As shown in FIGS. 4 and 5, the second hooks 83 are arranged outwardly of the first hooks 73 in the radial directions of the heat exchanger 11. In the present embodiment, due to a difference in coefficient of thermal expansion between materials, a rate of change in the volume of the holder 90 holding the second hooks 83 is larger than a rate of change in the volume of the flow-passage structure 70 to which the first hooks 73 are fixed during polishing of the wafer W. Therefore, the second hooks 83 are displaced in the direction away from the first hooks 73 during polishing of the wafer W.

The above-described arrangement of the second hooks 83 with respect to the first hooks 73 can prevent lateral loads from being applied from the second hooks 83 to the first hooks 73 when the temperatures of the flow-passage structure 70 and the holder 90 rise. As a result, the reliability of the temperature regulating apparatus 5 can be further improved.

Figure 7:
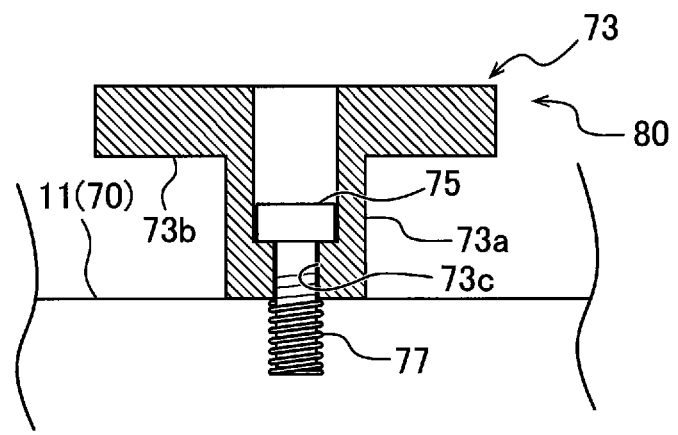
FIG. 7 is a schematic view showing an embodiment of a method of fixing a first hook.
Figure 8:
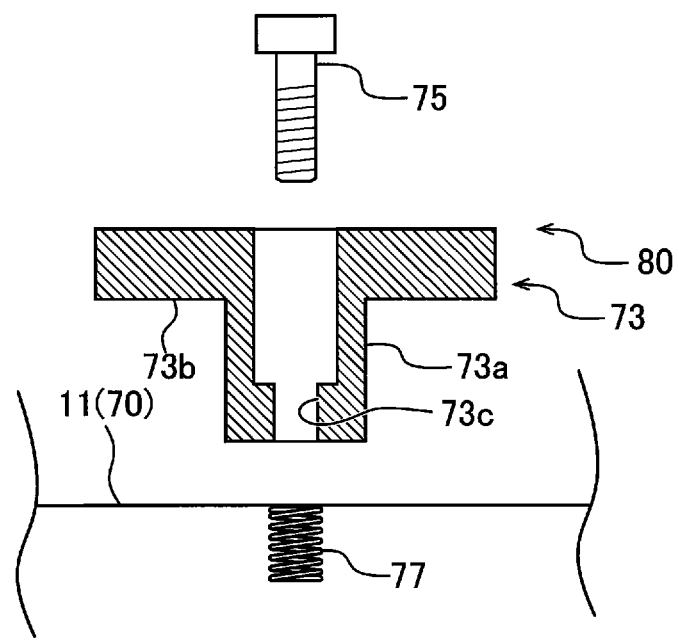
FIG. 8 is a schematic view showing a state in which the first hook of FIG. 7 is removed from the heat exchanger.

FIG. 7 is a schematic view showing an embodiment of a method of fixing the first hook 73 to the heat exchanger 11, and FIG. 8 is a schematic view showing a state in which the first hook 73 of FIG. 7 is removed from the heat exchanger 11. In FIGS. 7 and 8, the second hook 83, the holder 90, the heating flow passage 61, and the cooling flow passage 62 are not shown. As shown in FIGS. 7 and 8, the coupling mechanism 80 further includes a screw 75 arranged in the first hook 73, and a spiral structure 77 embedded in the heat exchanger 11 (i.e., in the flow-passage structure 70). The screw 75 is screwed into the spiral structure 77 through a through-hole 73c formed in the first hook 73.

The screw 75 and the spiral structure 77 are made of metal (e.g., stainless steel). The spiral structure 77 comprises a spiral coil. The spiral structure 77 is available on the market as helicoid insert or helical insert. According to such configurations, since the spiral structure 77 has a small amount of change in thermal expansion, excessive load is not applied from the spiral structure 77 to the heat exchanger 11 even when the temperature of the heat exchanger 11 rises during polishing of the wafer W and re-forming of the coating layer 91. As a result, generation of excessive stress in the heat exchanger 11 is prevented.

Figure 9:
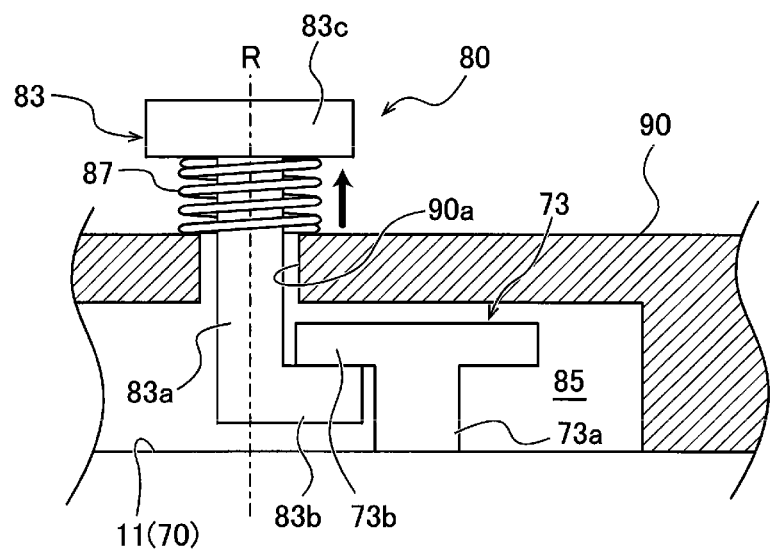
FIG. 9 is a schematic view showing another embodiment of a coupling mechanism.

FIG. 9 is a schematic view showing another embodiment of the coupling mechanism 80. The details of the present embodiment, which are not particularly described, are the same as those of the embodiments described with reference to FIGS. 1 to 6, and thus the duplicate descriptions thereof will be omitted. The coupling mechanism 80 of the present embodiment further includes a coil spring 87 into which the second base 83a is inserted. The coil spring 87 is arranged on the upper surface of the holder 90. When the second hook 83 and the first hook 73 are in engagement, an upward force indicated by an arrow in FIG. 9 is applied from the coil spring 87 to a head portion 83c of the second hook 83. Specifically, the second hook 83 is pushed upward by the coil spring 87, so that an upward force is applied from the second protrusion 83b of the second hook 83 to the first protrusion 73b of the first hook 73. As a result, the heat exchanger 11 is more securely fixed to the holder 90. The embodiment described with reference to FIGS. 7 and 8 may be applied to the present embodiment described with reference to FIG. 9.

Figure 10:
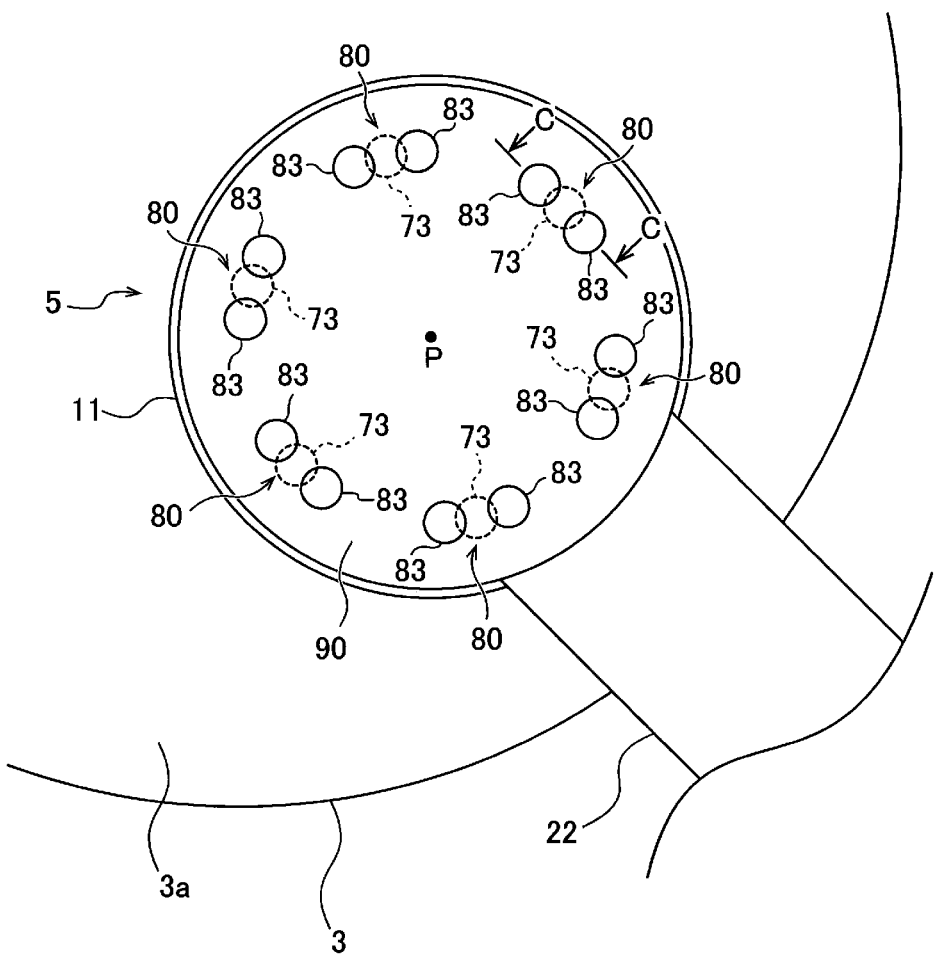
FIG. 10 is a schematic view showing another embodiment of a method of fixing the heat exchanger.
Figure 11:
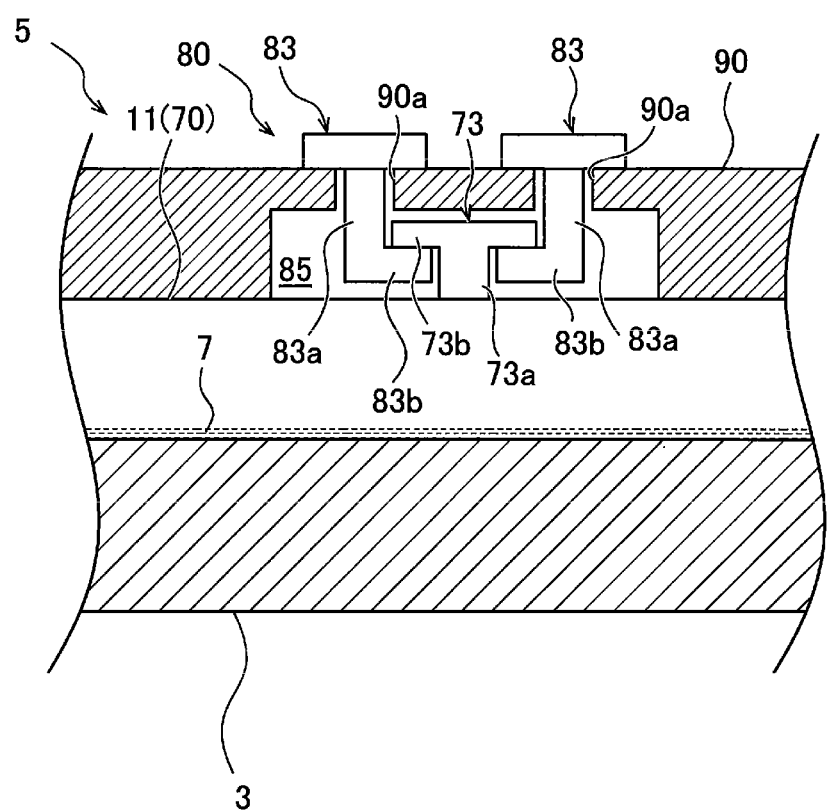
FIG. 11 is a cross-sectional view taken along line C-C of FIG. 10.
Figure 12:
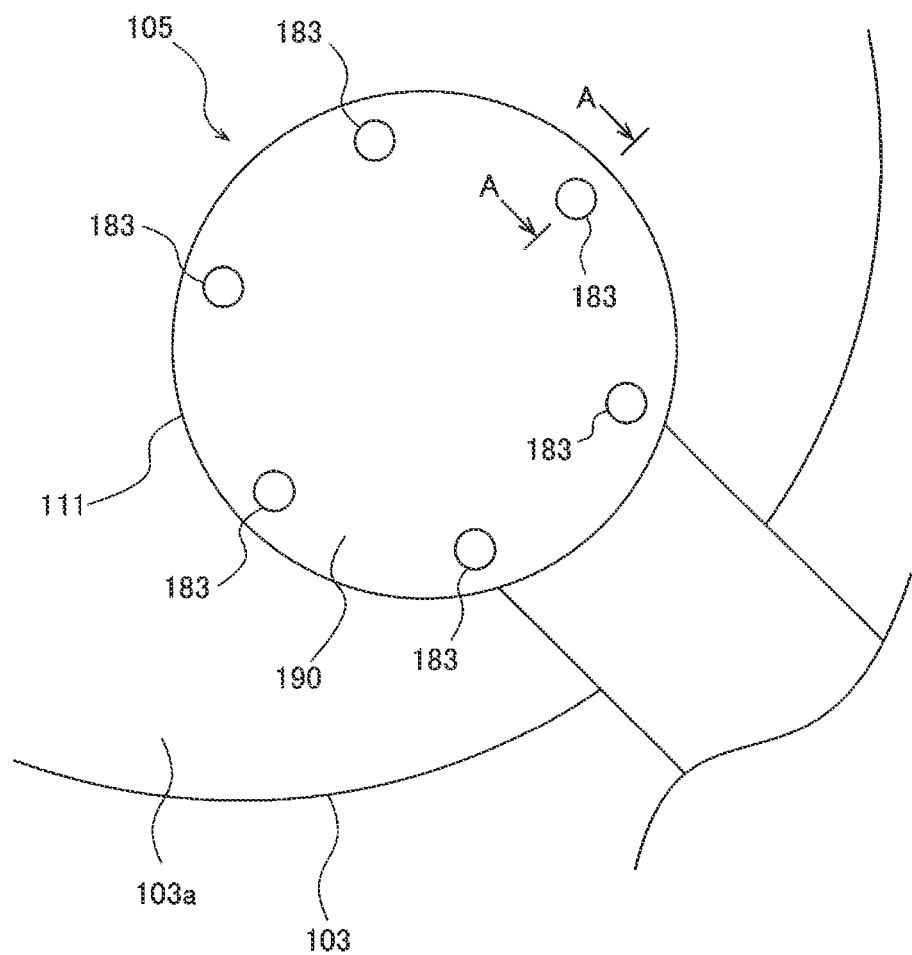
FIG. 12 is a schematic diagram showing a conventional temperature regulating apparatus.
Figure 13:
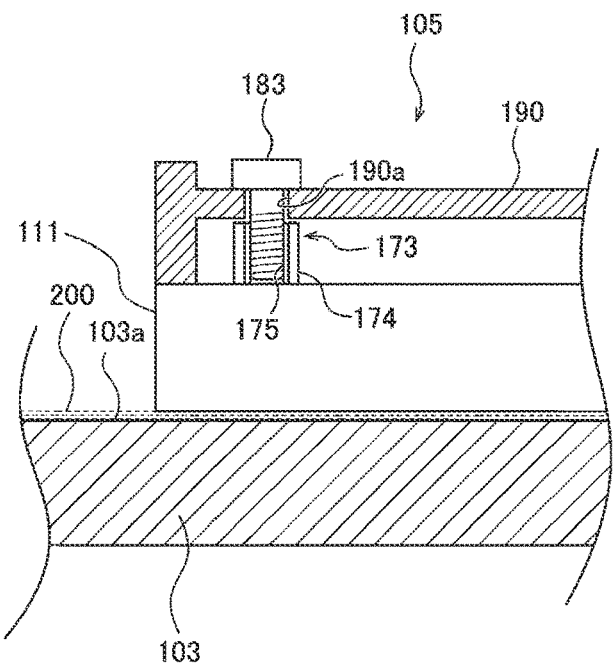
FIG. 13 is a cross-sectional view taken along line A-A of FIG. 12.

FIG. 10 is a schematic view showing another embodiment of a method of fixing the heat exchanger 11, and FIG. 11 is a cross-sectional view taken along line C-C of FIG. 10. The details of the present embodiment, which are not particularly described, are the same as those of the embodiments described with reference to FIGS. 1 to 6, and thus the duplicate descriptions thereof will be omitted. As shown in FIGS. 10 and 11, each coupling mechanism 80 of the present embodiment includes two second hooks 83. The two second hooks 83 are arranged on both sides of the first hook 73 in the circumferential direction of the heat exchanger 11.

In this embodiment, since the two second hooks 83 can be engaged with one first hook 73, the heat exchanger 11 can be more reliably fixed to the holder 90. Further, since the two second hooks 83 are arranged on both sides of the first hook 73 in the circumferential direction of the heat exchanger 11, a lateral load is not applied from the second hooks 83 to the first hook 73 even when the temperatures of the flow-passage structure 70 and the holder 90 rise during polishing of the wafer W. As a result, the reliability of the temperature regulating apparatus 5 can be further improved. The embodiment described with reference to FIGS. 7 to 9 may be applied to the present embodiment described with reference to FIGS. 10 and 11.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a temperature regulating apparatus for regulating a temperature of a polishing surface of a polishing pad used for polishing a substrate, such as a wafer. Further, the present invention is applicable to a polishing apparatus including such a temperature regulating apparatus.

REFERENCE SIGNS LIST 1 polishing head
2 polishing table
3 polishing pad
4 slurry supply nozzle
5 temperature regulating apparatus
6 table motor
7 slurry
10 polishing apparatus
11 heat exchanger
20 elevating mechanism
22 arm
30 fluid supply system
31 heating-fluid supply tank
32 heating-fluid supply pipe
33 heating-fluid return pipe
39 pad temperature measuring device
40 operation controller
41 first on-off valve
42 first flow-rate control valve
51 cooling-fluid supply pipe
52 cooling-fluid discharge pipe
55 second on-off valve
56 second flow-rate control valve
60 cleaning nozzle
61 heating flow passage
62 cooling flow passage
64 arc flow passage
65 inclined flow passage
70 flow-passage structure
73 first hook
73a first base
73b first protrusion
75 screw
77 spiral structure
80 coupling mechanism
83 second hook 83a second base
83b second protrusion
83c head portion
85 housing chamber
87 coil spring
90 holder
90a through-hole
91 coating layer
103 polishing pad
105 temperature regulating apparatus
111 heat exchanger
173 socket
174 outer cylindrical body
175 female thread
183 bolt
190 holder
200 slurry

The invention claimed is:

1. A temperature regulating apparatus for regulating a temperature of a polishing surface of a polishing pad, comprising:
   a heat exchanger having a heating flow passage and a cooling flow passage formed therein;
   a holder arranged over the heat exchanger;
   a coupling mechanism configured to detachably fix the heat exchanger to the holder, the coupling mechanism including:
   a first hook fixed to an upper surface of the heat exchanger; and
   a second hook held by the holder, the second hook being configured to be able to be engaged with and disengaged from the first hook.

2. The temperature regulating apparatus according to claim 1, wherein the first hook includes:
   a first base fixed to the upper surface of the heat exchanger; and
   a first protrusion protruding laterally from the first base, the second hook includes:
   a second base extending through the holder; and
   a second protrusion protruding laterally from the second base, the second protrusion being configured to be able to contact a lower surface of the first protrusion.

3. The temperature regulating apparatus according to claim 1, wherein the second hook is rotatable about its own axis.

4. The temperature regulating apparatus according to claim 1, wherein the coupling mechanism further includes:
   a screw arranged in the first hook; and
   a spiral structure embedded in the heat exchanger, the screw being screwed into the spiral structure through a through-hole formed in the first hook.

5. The temperature regulating apparatus according to claim 1, to wherein the coupling mechanism further includes a coil spring into which the second base is inserted, the coil spring being arranged on an upper surface of the holder.

6. The temperature regulating apparatus according to claim 1, wherein the holder has a housing chamber in which the first hook and the second hook are arranged.

7. The temperature regulating apparatus according to claim 1, wherein the second hook is arranged outwardly of the first hook in a radial direction of the heat exchanger.

8. The temperature regulating apparatus according to claim 1, wherein the second hook comprises two second hooks, the two second hooks being arranged on both sides of the first hook in a circumferential direction of the heat exchanger.

9. The temperature regulating apparatus according to claim 1, wherein the coupling mechanism comprises a plurality of coupling mechanisms arranged in a circumferential direction of the heat exchanger.

10. The temperature regulating apparatus according to claim 1, wherein the heat exchanger has a side surface composed of a water-repellent coating layer.

11. A polishing apparatus comprising:
    a polishing table configured to support a polishing pad;
    a polishing head configured to press a substrate against a polishing surface of the polishing pad; and
    the temperature regulating apparatus according to claim 1 configured to regulate a temperature of the polishing surface by exchanging heat with the polishing pad.

* * * * *